(12) United States Patent
Cho et al.

(10) Patent No.: US 7,085,154 B2
(45) Date of Patent: Aug. 1, 2006

(54) DEVICE AND METHOD FOR PULSE WIDTH CONTROL IN A PHASE CHANGE MEMORY DEVICE

(75) Inventors: Woo-yeong Cho, Kyungki-do (KR); Kyung-hee Kim, Suwon (KR)

(73) Assignee: Samsung Electronics Co., Ltd. (KR)

( * ) Notice: Subject to any disclaimer, the term of this patent is extended or adjusted under 35 U.S.C. 154(b) by 52 days.

(21) Appl. No.: 10/773,901

(22) Filed: Feb. 6, 2004

(65) Prior Publication Data

US 2004/0246804 A1   Dec. 9, 2004

(30) Foreign Application Priority Data

Jun. 3, 2003   (KR) ...................... 10-2003-0035564

(51) Int. Cl.
*G11C 11/00*   (2006.01)
(52) U.S. Cl. ............. 365/163; 365/185.21; 365/185.22
(58) Field of Classification Search ........... 365/185.22, 365/113, 163, 185.21, 189.04
See application file for complete search history.

(56) References Cited

U.S. PATENT DOCUMENTS

| | | | | |
|---|---|---|---|---|
| 6,075,719 | A | 6/2000 | Lowrey et al. | 365/148 |
| 6,222,771 | B1 * | 4/2001 | Tang et al. | 365/185.22 |
| 6,487,113 | B1 | 11/2002 | Park et al. | 365/163 |
| 6,545,907 | B1 * | 4/2003 | Lowrey et al. | 365/163 |
| 6,570,784 | B1 * | 5/2003 | Lowrey | 365/163 |
| 6,608,773 | B1 * | 8/2003 | Lowrey et al. | 365/100 |
| 6,813,177 | B1 * | 11/2004 | Lowrey et al. | 365/148 |
| 6,862,214 | B1 * | 3/2005 | Lee et al. | 365/163 |
| 6,873,561 | B1 * | 3/2005 | Ooishi | 365/226 |
| 2003/0002332 | A1 | 1/2003 | Lowrey | 365/163 |
| 2005/0117387 | A1 * | 6/2005 | Hwang et al. | 365/163 |

OTHER PUBLICATIONS

Geppert, Linda. "The New Indelible Memories", IEEE Spectrum, Mar. 2003, pp. 49-54.

* cited by examiner

*Primary Examiner*—Richard Elms
*Assistant Examiner*—Alexander Sofocleous
(74) *Attorney, Agent, or Firm*—Mills & Onello LLP

(57) ABSTRACT

A circuit and method for programming phase-change memory devices, such as chalcogenide memory (PRAM), are described. The invention is directed to an approach to programming PRAM elements from a reset state to a set state or from a set state to the set state. The invention provides a novel and nonobvious PRAM device and method in which a set pulse duration time is controlled by monitoring the state of the memory element during programming such as by comparing the voltage of a bit line with a reference voltage or comparing the cell resistance with a set state cell resistance. The duration of the set pulse is controlled in response to the detected state of the memory element. The result of the approach of the invention is the significant reduction in PRAM programming errors, such as those caused by a constant-duration set pulse, as well as reduction in programming time duration and power consumption.

54 Claims, 11 Drawing Sheets

DEVICE AND METHOD FOR PULSE WIDTH CONTROL IN A PHASE CHANGE MEMORY DEVICE

RELATED APPLICATION

This application relies for priority on Korean patent application number 03-0035564, filed on Jun. 3, 2003, the contents of which are incorporated herein in their entirety by reference.

FIELD OF THE INVENTION

The present invention related to phase-change memory devices and, more particularly, to a device and method for programming a phase-change memory device using programming pulse width control.

BACKGROUND OF THE INVENTION

A phase change memory or phase change random access memory (PRAM) as referred to herein is also referred to as an ovonic unified memory (OUM) in the art. The OUM is based on a chalcogenide alloy, which, after being heated and cooled, adopts one of two stable but programmable phases: polycrystalline or amorphous. Resistance of the first phase, i.e., the polycrystalline phase, is low, and resistance of the second phase, i.e., the amorphous phase, is high. A logical one (1) or zero (0) depends on the phase of the programmable volume, determined by measuring its resistance. The crystalline or conductive state is the set or 0 state; and the amorphous or resistive non-conductive state is the reset or 1 state.

To make the programmable volume amorphous, it is heated above its melting point by a resistive heater. It cools rapidly when the heater is turned off. To make it crystalline, it is heated to just below its melting point for a short period of time, e.g., 50 ns, so that the atoms line up in their crystalline locations.

The key to the phase change memory is the chalcogenide material. The device includes an alloy of germanium (Ge), antimony (Sb) and tellurium (Te), which is referred to commonly as a GST alloy. The material is useful as a memory device because of its ability to switch rapidly, when heated and cooled, between the stable amorphous (reset or 1 state) and crystalline phases. In the amorphous phase, the material has low reflectivity and high resistance. In the crystalline phase, it is reflective and has a low resistance.

A memory cell that incorporates the chalcogenide material typically includes a top electrode, a layer of the chalcogenide, and a resistive heating element. Reading the programmed cell is done by measuring its resistance. To write data to a cell, the chalcogenide is heated past its melting point and then rapidly cooled to make it amorphous. To make it crystalline, it is heated to just below its melting point and held there for a short period of time, giving the atoms in the material time to position themselves in their crystal locations.

FIG. 1 is a schematic diagram illustrating a memory cell 10 which uses the programmable chalcogenide material. The cell 10 includes a conductive top electrode 12 formed over the programmable phase change chalcogenide material 14. A conductive bottom electrode contact (BEC) 16 connects the top electrode 12 and programmable material 14 to a conductive bottom electrode 18.

FIGS. 2A and 2B are schematic diagrams which illustrate the cell 10 in each of the two programmed states. In FIG. 2A, the cell 10 is shown in the conductive set or 0 state. In this state, the programmable material 14 is in the crystalline state. In FIG. 2B, the cell 10 is shown in the resistive reset or 1 state. In this state, the programmable material 14 is in the amorphous state. Each of FIGS. 2A and 2B also shows the access transistor 20 used in controlling the flow of current through the cell 10. As current flows through the cell 10, the BEC behaves as a resistive heater which heats the volume of programmable material to alter its state.

FIG. 3 is a schematic diagram illustrating the electrical configuration of the cell 10. In FIG. 3, the cell is referred to as "C." A word line WL controls activation of the cell C. The current through the cell, $I_{CEL}$, and bit line BL serves to program the device 10.

FIG. 4 is a timing diagram illustrating programming of a memory cell that includes a programmable chalcogenide material. The timing diagram of FIG. 4 is a graph of temperature over time illustrating the programming pulses for programming the material to the set (crystalline) state and the reset (amorphous) state, in accordance with programming approaches of the prior art. The curve labeled 35 illustrates the temperature-time relationship for the reset pulse, i.e., the temperature pulse used to program the material to the reset (amorphous) state; and the curve labeled 36 illustrates the time-temperature relationship for the set pulse, i.e., the temperature pulse used to program the material to the set (crystalline) state.

Referring to the curve labeled 35 in FIG. 4, to change the programmable volume of chalcogenide material to the amorphous phase (reset state), the chalcogenide alloy is heated to a temperature above its melting point (Tm) by a resistive heater. The heating pulse is applied for a relatively short period of time, e.g., a few nanoseconds. The alloy cools rapidly when the heater is turned off. Referring to the curve labeled 36, to change the programmable volume to the crystalline phase (set state), the alloy is heated to a temperature below its melting point. As shown in the figure, the temperature to which the alloy is heated is within a set window between a crystallization or curing temperature Tx and the melting temperature Tm. The elevated temperature is maintained in the set window for a time period of about 50 ns to allow the alloy to crystallize, that is, to allow the atoms in the material to align in their crystalline structure. After the crystallization takes place, the set pulse is removed, and the material cools.

FIG. 5 is a graph illustrating the current-voltage (I-V) characteristics of the PRAM cell using the chalcogenide material for a cell in the set state and the reset state. The curve labeled 37 shows the I-V characteristic for a cell in the set state, and the curve labeled 38 shows the I-V characteristic for a cell in the reset state. The PRAM is programmed by a current pulse at a voltage above a switching threshold voltage Vt. The programming pulse drives the memory cell into a high or low resistance state, which depends upon the magnitude of the current. Information stored in the cell is read out by measuring the cell's resistance. Read operations are performed at a voltage below the threshold voltage Vt to avoid error potentially caused by inadvertent phase alteration of the material.

FIG. 6 is a timing diagram of a set pulse used conventionally to program phase-change memory elements to the set state. The set pulse is applied to a bit line to program phase-change memory elements to the set state. The set pulse duration T2-T1 in the conventional technology is constant.

FIG. 7 is a graph of cell resistance versus time during programming of a phase-change memory cell from a reset state to a set state for a normal condition (condition A) and an error condition (condition B). The resistance of the cell in the reset state is referred to as $R_{RESET}$, and the resistance of the cell in the set state is referred to as $R_{SET}$. The value of $R_{RESET}$ is generally determined by the size of the bottom electrode contact (BEC) 18 of the device. The curve labeled 41 is for a memory cell A in a normal reset state being programmed to the set state. The curve labeled 42 is for a second memory cell B in an abnormal reset state being programmed to the set state. The cell B is in an abnormal reset state in that its reset resistance $R_{RESETB}$ is abnormally high.

Referring to curve 41, in the reset state, the resistance in cell A is a normal level $R_{RESETA}$. At time T1, the set pulse is activated. As the cell is heated, its resistance drops as shown. The resistance crosses the resistance threshold reference as it transitions to the set state. The reference defines the cell resistance boundary between the reset state and the set state. At time T2, after the cell A reaches the set state, the set pulse is removed. The cell cools and remains in the set state, at a normal set resistance of $R_{SETA}$.

Referring to curve 42, the resistance of the cell B begins at the abnormally high level of $R_{RESETB}$. At time T1, the set pulse is applied, and the resistance of the cell begins dropping. Because the duration of the set pulse window is predefined and set at a constant, at time T2, the set pulse is removed. However, in this case, because the resistance in the reset condition was abnormally high, the duration of the set pulse was not long enough to allow the resistance of the cell to decrease past the reference level such that the cell could enter the set state. Instead, the set pulse is removed at T2 while the cell resistance $R_{SETB}$ is still above the reference. When the cell cools, the resistance $R_{SETB}$ remains above the reference. As a result, the cell has not been correctly programmed to the set state. That is, a cell programming error has occurred.

Thus, because the set pulse duration is constant, errors in the PRAM programming may occur because the value of $R_{SET}$ may vary depending on the value of $R_{RESET}$. Specifically, if the value of $R_{RESET}$ is high, then the value of $R_{SET}$ may be too high after set programming to be stable in the set state.

SUMMARY OF THE INVENTION

The invention is directed to an approach to programming phase-change memory devices, such as chalcogenide memory (PRAM). The invention is directed to an approach to programming PRAM elements from a reset state to a set state or from a set state to the set state. The invention provides a novel and nonobvious PRAM device and method in which a set pulse duration time is controlled by monitoring the state of the memory element during programming such as by comparing the voltage of a bit line with a reference voltage or comparing the cell resistance with a set state cell resistance. The duration of the set pulse is controlled in response to the detected state of the memory element. The result of the approach of the invention is the significant reduction in PRAM programming errors, such as those caused by a constant-duration set pulse, as well as reduction in programming time duration and power consumption.

In one aspect, the invention is directed to a method of programming a semiconductor memory device. According to the method of the invention, a set pulse is applied to the memory device. While the set pulse is applied, a state of the memory device is detected. When the memory device is determined to be in a desired set state, the set pulse is removed, such that duration of the set pulse is controlled based on the state of the memory device.

In one embodiment, when the memory device is in a reset state, a programmable material of the memory device is in an amorphous state. Also, when the memory device is in the set state, a programmable material of the memory device is in a crystalline state. When the memory device is in a reset state, a programmable material of the memory device is in an amorphous state.

Detecting a state of the memory device can include detecting a resistance in the device. The detected resistance comprises resistance in a programmable material of the memory device. In one embodiment, resistance of the programmable material in an amorphous state of the programmable material is higher than resistance of the programmable material in a crystalline state of the programmable material.

In one embodiment, detecting a state of the memory device comprises detecting a voltage of a bit line of the memory device. Applying a set pulse to the memory device can include generating a control signal which controls application of the set pulse to the memory device. The control signal can be generated to cause the set pulse to be activated, such as in response to a write enable signal. The control signal can be generated to cause the set pulse to be removed when the detected bit line voltage is below a reference voltage. The control signal can also be generated to cause the set pulse to be removed when the detected bit line voltage is equal to a reference voltage. In one embodiment, the reference voltage is a set programming voltage of a programmable material in the memory device. In one embodiment, when the memory device is being programmed to a set state from a reset state, the control signal is generated to cause the set pulse to be applied while the memory device transitions from the reset state to the set state and removed after the transition. In one embodiment, when the memory device is being programmed to a set state from a reset state, the control signal is generated to cause the set pulse to be applied while the detected bit line voltage is above a reference voltage and removed after the detected bit line voltage drops below the reference voltage. In one embodiment, when the memory device is being programmed to a set state from the set state, the control signal is generated to be applied in response to a write enable signal and removed when it is determined that the detected bit line voltage is below a reference voltage. In one embodiment, when the memory device is being programmed to a set state from the set state, the control signal is generated to be applied in response to a write enable signal and removed when it is determined that the detected bit line voltage is equal to a reference voltage.

In one embodiment, applying a set pulse to the memory device comprises applying a current to a bit line of the memory device. Detecting a state of the memory device can include detecting a voltage of the bit line while the current is applied to the bit line.

In one embodiment, applying a set pulse to the memory device comprises generating a control signal which controls application of the set pulse to the memory device.

The memory device can include a phase change material. The phase change material can include germanium, antimony and tellurium.

The memory device can include at least one chalcogenide element.

In one embodiment, a reset current in the memory device is greater than a set current in the memory device. In one embodiment, a reset pulse width is narrower than a set pulse width.

In another aspect, the invention is directed to a semiconductor memory device. The device includes a detecting circuit for detecting a state of the memory device and a controller for applying a set pulse to the memory device, the controller removing the set pulse when the memory device is detected to be in a desired set state, such that duration of the set pulse is controlled based on the state of the memory device.

In one embodiment, the device also includes a programmable material, wherein, in a first state, the programmable material is in an amorphous state. Alternatively, in a first state, the programmable material is in a crystalline state, and, in a second state, the programmable material is in an amorphous state.

In one embodiment, the detecting circuit detects a resistance in the device. The detected resistance can include resistance in a programmable material of the memory device. In one embodiment, the detecting circuit detects a voltage of a bit line of the memory device. The detecting circuit can include a sense amplifier. The sense amplifier can compare the voltage of the bit line to a reference voltage. The reference voltage can be a set programming voltage of a programmable material in the memory device.

In one embodiment, the controller also includes a control signal generator for generating a control signal which controls application of the set pulse to the memory device. The control signal can be generated to cause the set pulse to be activated, such as in response to a write enable signal. The control signal can be generated to cause the set pulse to be removed when the detected bit line voltage is below a reference voltage. Also, the control signal can be generated to cause the set pulse to be removed when the detected bit line voltage is equal to a reference voltage. In one embodiment, when the memory device is being programmed to a set state from a reset state, the control signal is generated to cause the set pulse to be applied while the memory device transitions from the reset state to the set state and removed after the transition. Also, in one embodiment, when the memory device is being programmed to a set state from a reset state, the control signal is generated to cause the set pulse to be applied while the detected bit line voltage is above a reference voltage and removed after the detected bit line voltage drops below the reference voltage. Also, in one embodiment, when the memory device is being programmed to a set state from the set state, the control signal is generated to be applied in response to a write enable signal and removed when it is determined that the detected bit line voltage is below a reference voltage. Also, in one embodiment, when the memory device is being programmed to a set state from the set state, the control signal is generated to be applied in response to a write enable signal and removed when it is determined that the detected bit line voltage is equal to a reference voltage.

The device of the invention can also include a driver for applying a current to a bit line of the memory device. The driver can apply a set current to the bit line in response to a set enable signal. The driver can apply a reset current to the bit line in response to a reset enable signal. The detecting circuit can detect a voltage of the bit line while the current is applied to the bit line.

In one embodiment, the controller also includes a control signal generator which generates a control signal which controls application of the set pulse to the memory device.

In one embodiment, the memory device comprises a phase change material. The phase change material can include germanium, antimony and tellurium.

In one embodiment, the memory device comprises at least one chalcogenide element.

In one embodiment, a reset current in the memory device is greater than a set current in the memory device. In one embodiment, a reset pulse width is narrower than a set pulse width.

As a result of the procedure of the invention in which the state of the cell being programmed is monitored during programming, more efficient programming with reduced programming errors is obtained. In the case of programming the cell to the set state from either the reset state or the set state, the duration of the set pulse is adjusted based on the detected state of the cell during programming. The set pulse is removed only after it is determined that the cell has reached the set state. Programming errors due to variations in reset resistance of the cell are eliminated. In the case of programming a cell from the set state to the set state, the duration of the programming procedure is shortened because the procedure detects that the cell is already in the set state, and the procedure is immediately terminated. This reduces the time and power consumption of the cell setting procedure.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS OF THE INVENTION

Figure 1:
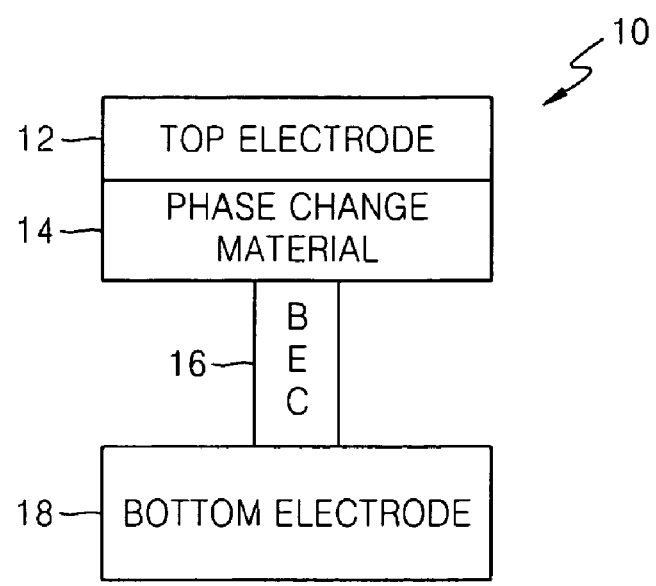
FIG. 1 is a schematic diagram illustrating a memory cell 10 which uses the programmable chalcogenide material.
Figure 2A:
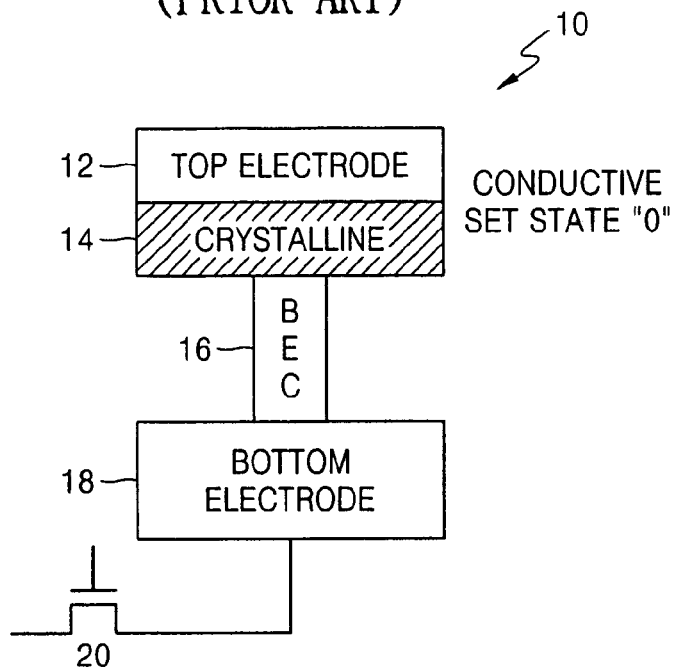
FIGS. 2A and 2B are schematic diagrams which illustrate the cell 10 in each of the two programmed states.
Figure 2B:
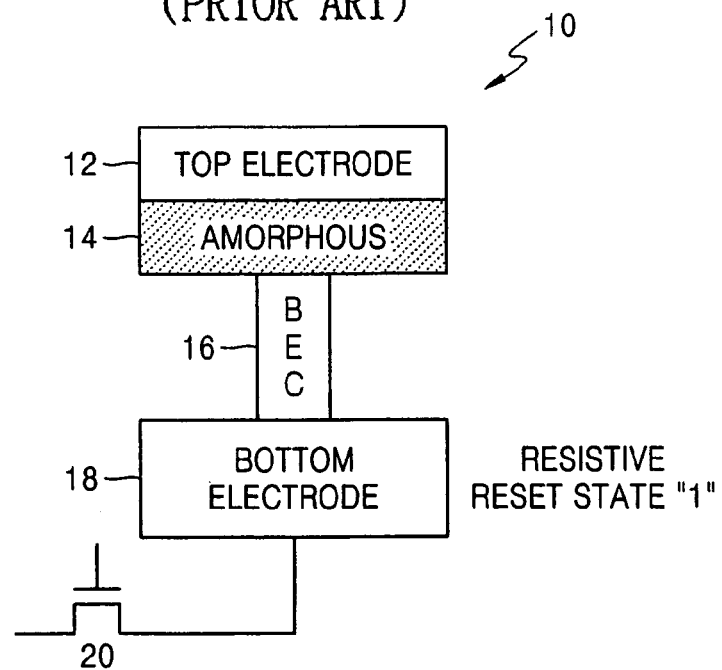
Figure 3:
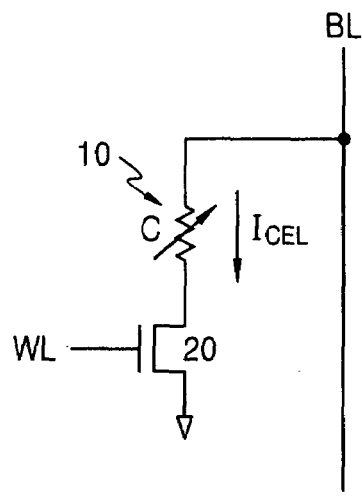
FIG. 3 is a schematic diagram illustrating the electrical configuration of the cell 10.
Figure 4:
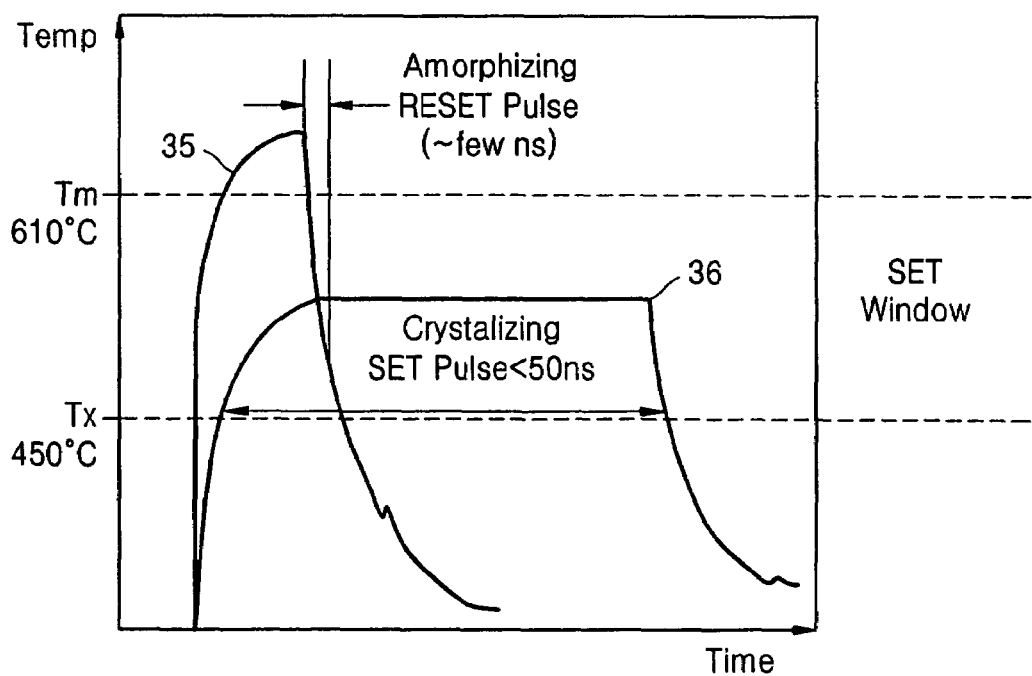
FIG. 4 is a timing diagram illustrating programming of a memory cell that includes a programmable chalcogenide material.
Figure 5:
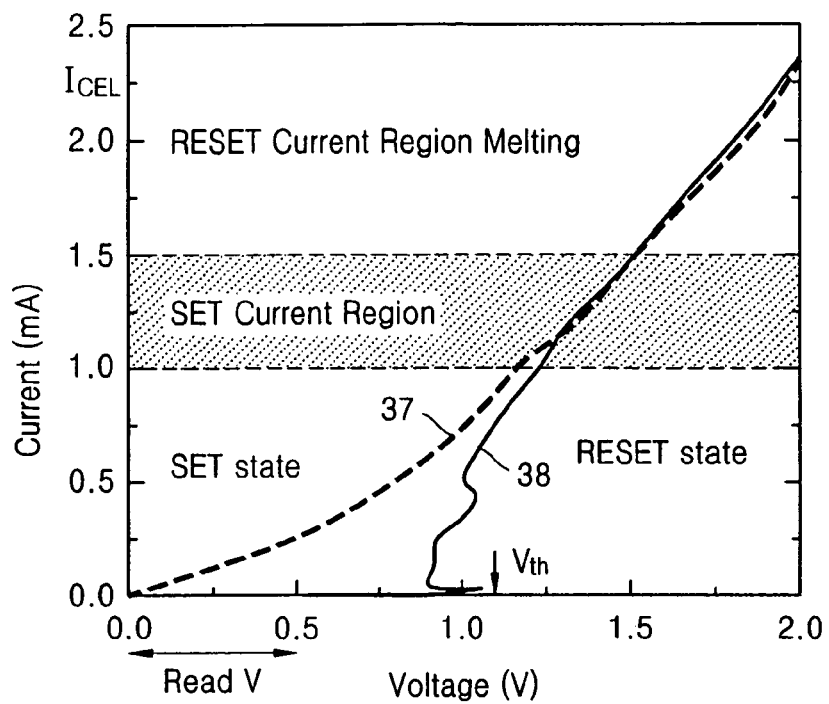
FIG. 5 is a graph illustrating the current-voltage (I-V) characteristics of the PRAM cell using the chalcogenide material for a cell in the set state and the reset state.
Figure 6:
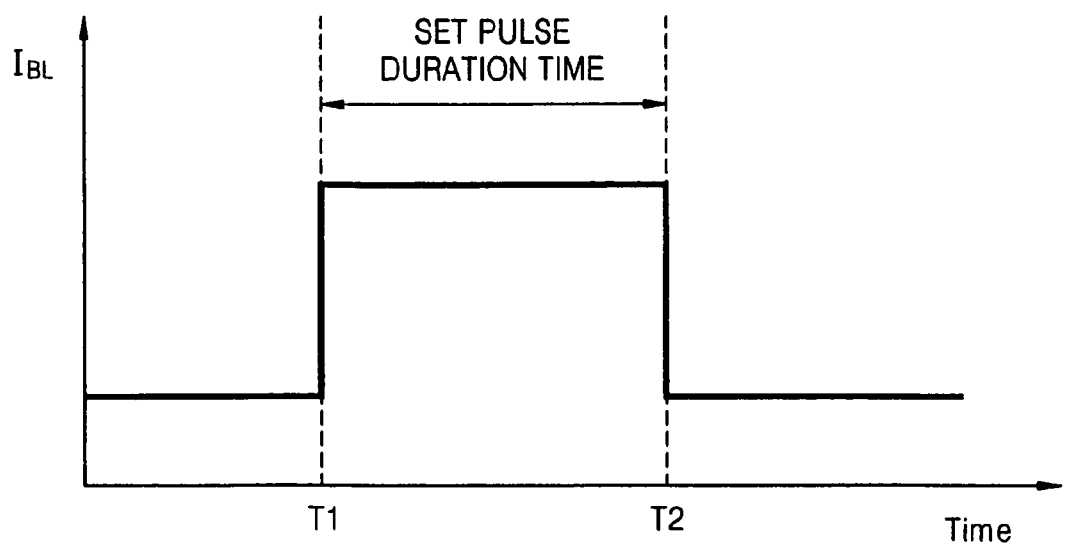
FIG. 6 is a timing diagram of a set pulse used conventionally to program phase-change memory elements to the set state.
Figure 7:
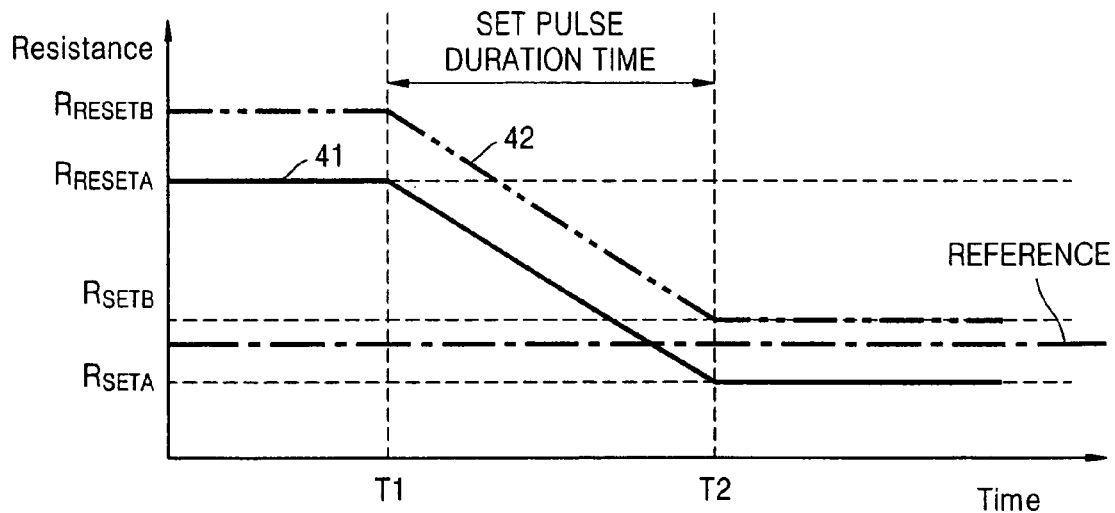
FIG. 7 is a graph of cell resistance versus time during programming of a phase-change memory cell from a reset state to a set state for a normal condition and an error condition.
Figure 8:
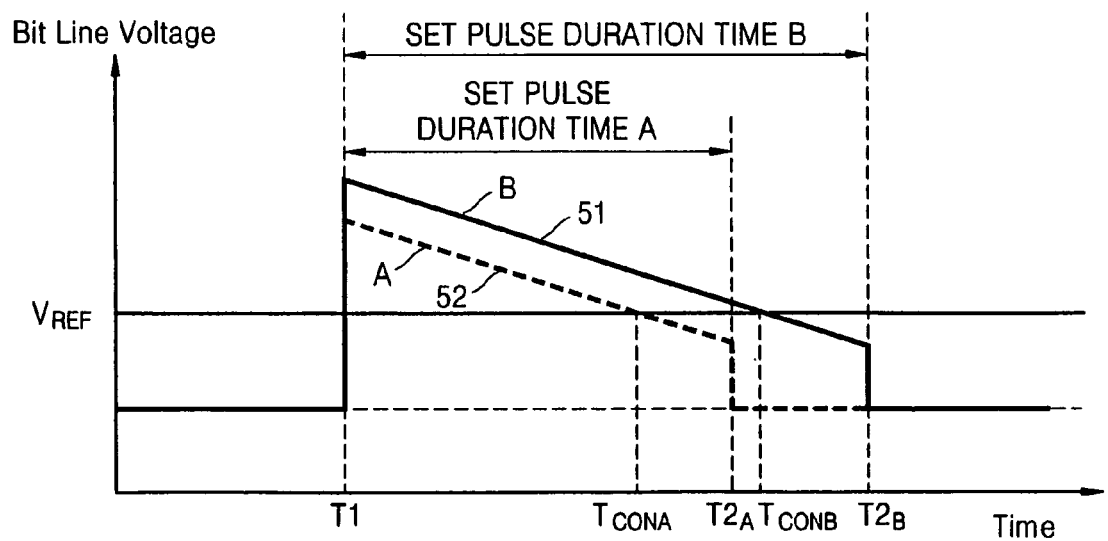
FIG. 8 is a timing diagram illustrating the timing of a set operation used to program a PRAM cell having a programmable chalcogenide material, in accordance with an embodiment of the invention.

FIG. 8 is a timing diagram illustrating the timing of a set operation used to program a PRAM cell having a programmable chalcogenide material, in accordance with an embodiment of the invention. In accordance with the invention, the voltage on the bit line of the cell being programmed is monitored during programming. When the bit line voltage reaches a threshold voltage $V_{REF}$, a control signal CTRLS is generated to deactivate the set pulse. The graph of FIG. 8 illustrates the detected bit line voltage over time during a programming operation for a first cell A in a normal condition and a second cell B having an abnormally high resistance. The curve labeled 51 is the bit line voltage for the cell B having the abnormally high resistance, and the curve labeled 52 is the bit line voltage for the cell A having the normal resistance. As shown in the graph of FIG. 8, the set pulse is applied in both cases at T1. The voltage on the bit lines rises immediately to an initial programming voltage. Since the programming current in both cases is the same, in the case of cell B, the initial bit line voltage is higher than that of cell A, since the resistance of cell B is higher. After reaching the initial voltage, the voltages in both cases begin to drop as the resistance of their respective cells begin to drop. When the bit line voltage reaches a reference voltage $V_{REF}$, at a time $T_{CONA}$ in the case of cell A and $T_{CONB}$ in the case of cell B, a control signal is CTRLS is generated to remove the set pulse after some delay. The set pulse is removed at time $T2_A$ in the case of cell A and $T2_B$ in the case of cell B. The duration of the set pulse in programming cell A is $T2_A$-T1, and the duration of the set pulse in programming cell B is $T2_B$-T1. The duration of the set pulse in the case of cell B is longer than that of cell A. This is because the set pulse is not deactivated until it is detected that the bit line voltage is below $V_{REF}$, and, as a result, the cell is in the set state. This takes longer in the case of cell B because the initial resistance of the cell was high. Hence, by monitoring the state of the cell during programming, the approach of the invention ensures that cells are properly programmed. That is, in the present invention, cell programming errors are substantially reduced.

Figure 9:
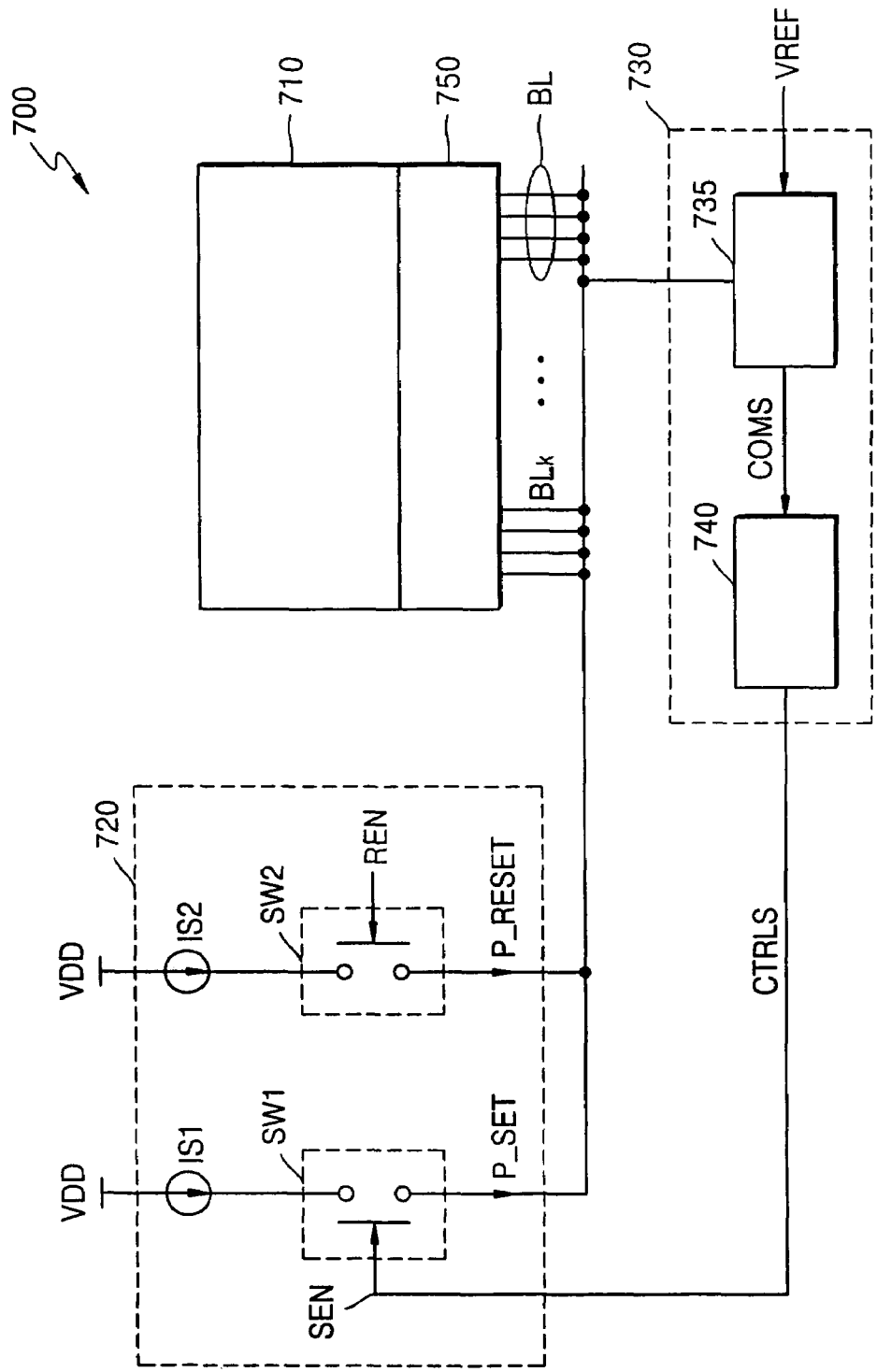
FIG. 9 is a schematic block diagram of a PRAM memory system having a circuit for programming a PRAM cell in accordance with the invention.

FIG. 9 is a schematic block diagram of a PRAM memory system having a circuit for programming a PRAM cell in accordance with the invention. The system 700 includes a PRAM memory cell array 710 which includes a plurality of PRAM memory cells. The cell array is connected to a column select circuit 750 which selects from a plurality of bit lines BL. The system 700 includes a write driver circuit 720 which includes the driving circuitry used to program the PRAM cells of the array 710. The write driver 720 includes a pair of current sources including a reset current source IS2 for providing a reset current to cell bit lines BL to program connected cells to the reset state and a set current source IS1 for providing a set current to cell bit lines BL to program connected cells to the set state.

The write driver 720 also includes a pair of switches SW1 and SW2 which control application of the set and reset current pulses to the cell array 710. The set switch SW1 applies the set pulse to the array 710 when it is closed, and the reset switch SW2 applies the reset pulse to the array 710 when it is closed. When a control signal CTRLS is active, the set enable signal SEN is active to close the set switch SW1 to apply the set pulse current signal P_SET to the array 710. When the reset enable signal REN is active, the reset switch SW2 closes to apply the reset pulse current signal P_RESET to the array 710.

The set control signal CTRLS is generated by an auto pulse width control block 730, which includes a comparator 735 and a control pulse signal generator 740. The comparator, which can include a sense amplifier, compares the voltage on the selected bit line to the reference voltage $V_{REF}$. During programming to the set state, when the bit line voltage drops below $V_{REF}$, the comparator signal COMS becomes active. In response, the control signal generator 740 generates an active set control signal CTRLS, which is transmitted to the set pulse switch SW1 in the write driver 720, causing the switch SW1 to open and thereby remove the set pulse.

Figure 10:
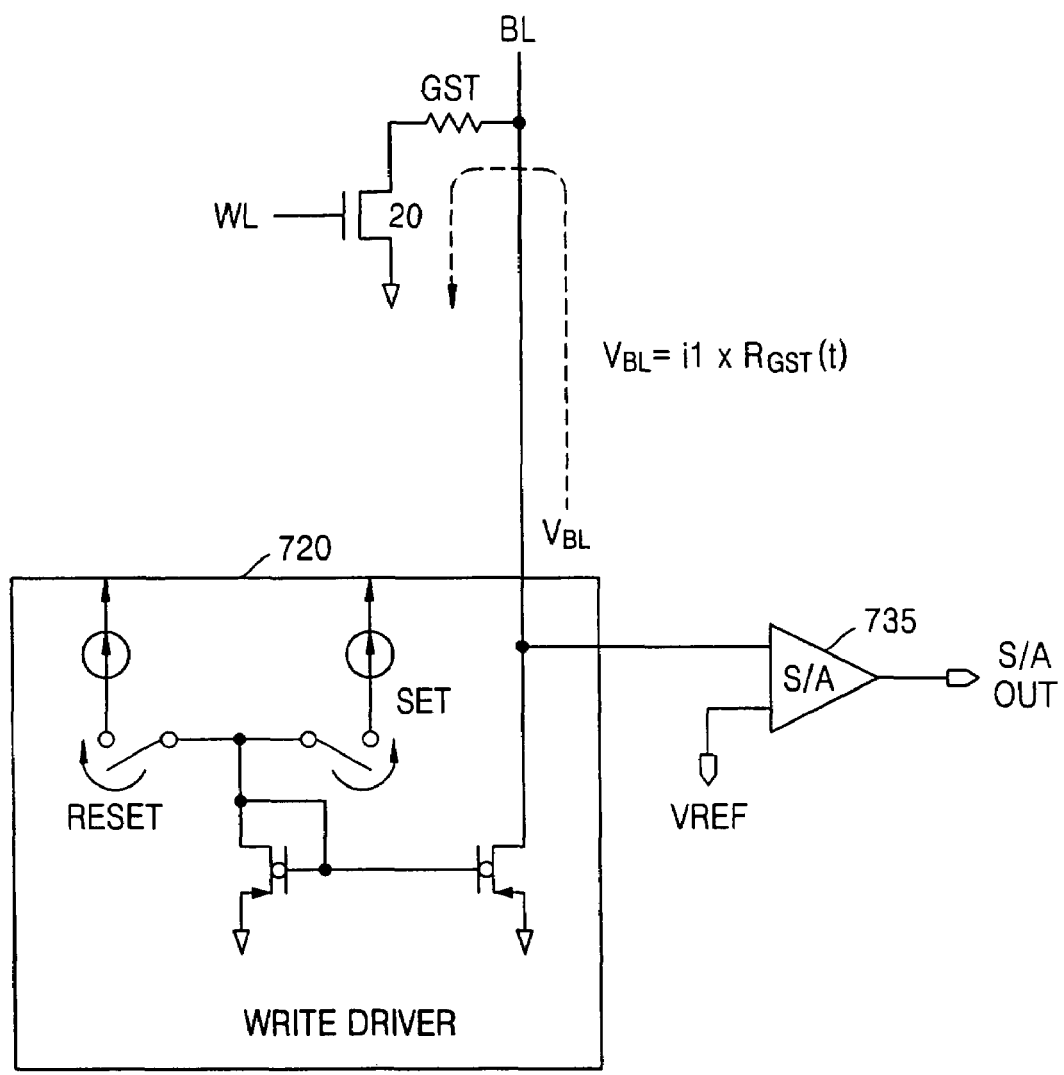
FIG. 10 is a detailed schematic diagram of one PRAM memory cell and a cell programming circuit, in accordance with the present invention.

FIG. 10 is a detailed schematic diagram of one PRAM memory cell and a cell programming circuit, in accordance with the present invention. FIG. 10 shows the write driver 720 connected to the bit line BL for programming the chalcogenide (GST) material of the memory cell. The programming current is permitted to pass through the cell by an active signal on the word line WL used in controlling a field effect transistor (FET) connected to the bit line BL as shown. As the current passes through the bit line BL and the cell, the voltage $V_{BL}$ on the bit line is applied to the comparator or sense amplifier 735 which compares the bit line voltage $V_{BL}$ to the reference voltage $V_{REF}$. When the bit line voltage $V_{BL}$ is below the reference voltage $V_{REF}$, the sense amplifier output is used to deactivate the set pulse.

Figure 11:
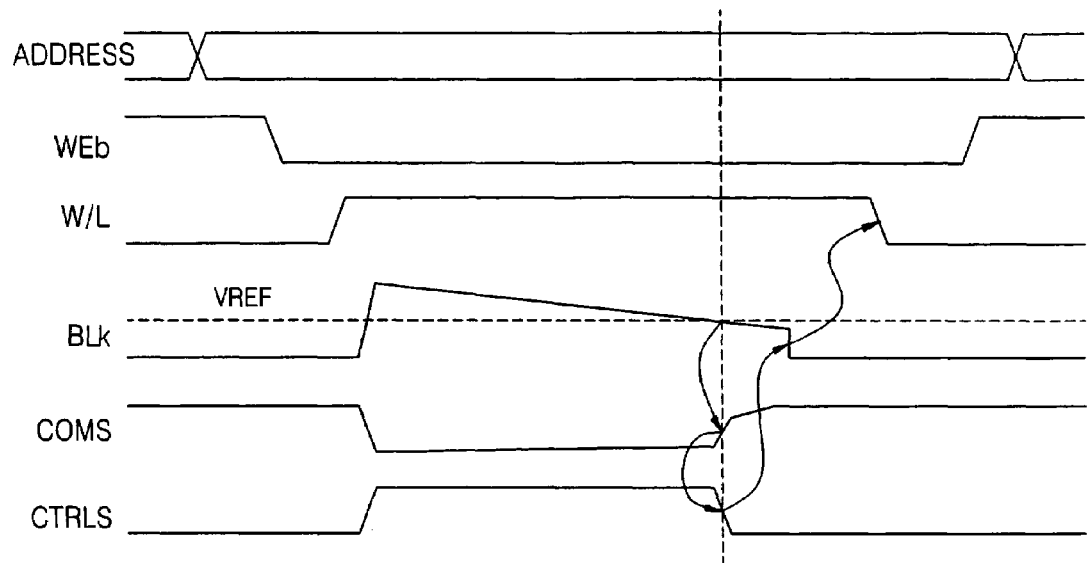
FIG. 11 is a timing diagram illustrating the timing of signals used in programming a PRAM cell from the reset state to the set state in accordance with the invention.

FIG. 11 is a timing diagram illustrating the timing of signals used in programming a PRAM cell from the reset state to the set state in accordance with the invention. As shown in the timing diagram, the write enable signal WEb is activated and then the word line enable signal W/L is activated. Shortly thereafter, the bit line voltage BLk rises rapidly above the reference voltage $V_{REF}$. As a result, the compare signal COMS drops and the control signal CTRLS rises to the active state to cause the set pulse to be applied in accordance with the foregoing description. When the bit line voltage BLk drops below the reference voltage $V_{REF}$, the compare signal COMS rises, and, in response, the control signal CTRLS drops to remove the set pulse. After some delay, the word line enable signal W/L drops and the write enable signal WEb rises. The result is that the selected cell is programmed from the reset state to the set state.

Figure 12:
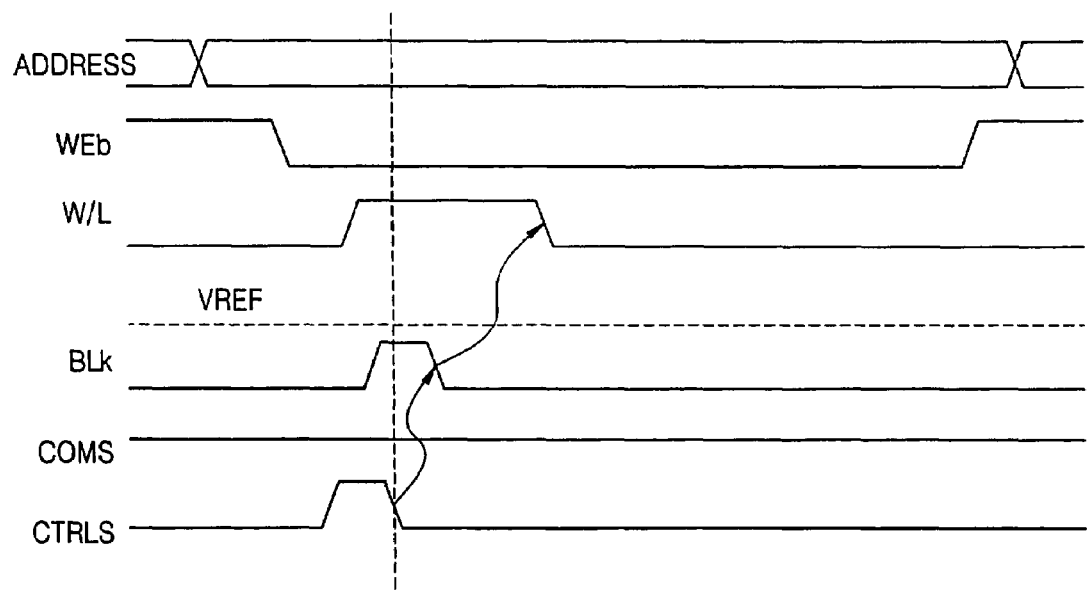
FIG. 12 is a timing diagram illustrating the timing of signals used in programming a PRAM cell from the set state to the set state in accordance with the invention.

FIG. 12 is a timing diagram illustrating the timing of signals used in programming a PRAM cell from the set state to the set state in accordance with the invention. That is, FIG. 12 illustrates the timing of signals involved in programming a PRAM cell that is already in the set (low resistance) state to the set state. As shown in the timing diagram, the write enable signal WEb is activated and then the word line enable signal W/L is activated. Shortly thereafter, the CTRLS signal becomes active to apply the set pulse and the bit line voltage BLk rises to a level below the reference voltage $V_{REF}$. Because the bit line voltage BLk does not rise above the reference voltage $V_{REF}$ the compare signal COMS does not drop. As a result, the control signal CTRLS drops very quickly to remove the set pulse because it is determined that the cell is already in the set state and the programming process need not continue. The W/L signal and the WEb signal then return to their respective inactive states to complete the programming procedure.

As a result of the procedure of the invention in which the state of the cell being programmed is monitored during programming, more efficient programming with reduced programming errors is obtained. In the case of programming the cell to the set state from either the reset state or the set state, the duration of the set pulse is adjusted based on the detected state of the cell during programming. The set pulse is removed only after it is determined that the cell has reached the set state. Programming errors due to variations in reset resistance of the cell are eliminated. In the case of programming a cell from the set state to the set state, the duration of the programming procedure is shortened because the procedure detects that the cell is already in the set state, and the procedure is immediately terminated. This reduces the time and power consumption of the cell setting procedure.

Figure 13:
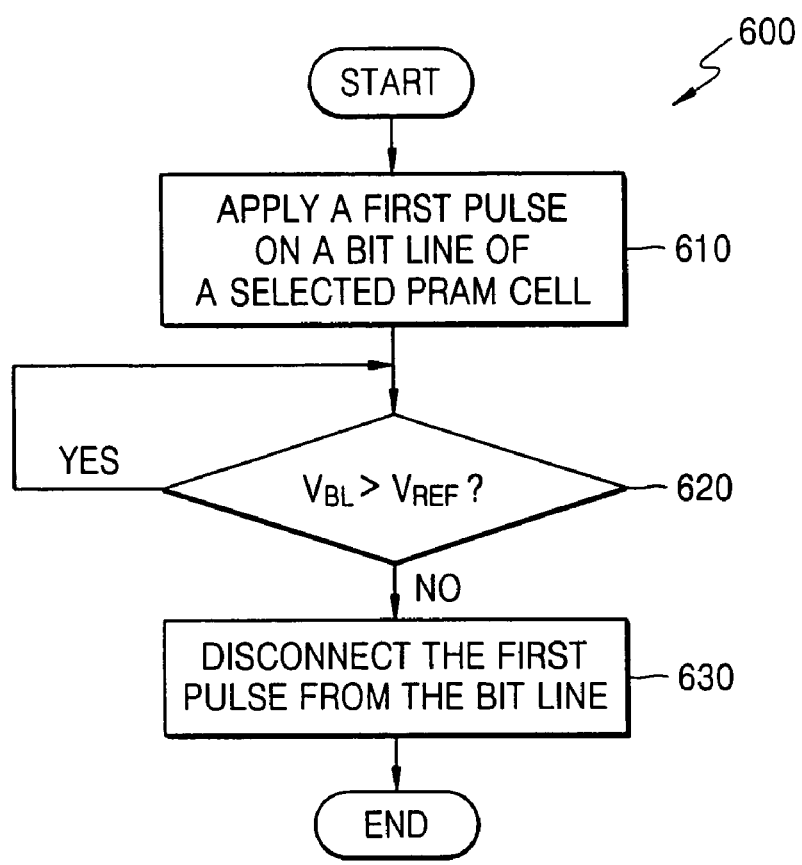
FIG. 13 is a flowchart illustrating the logical flow of a procedure for programming a PRAM cell to a set state, in accordance with a first embodiment of the invention.

FIG. 13 is a flowchart illustrating the logical flow of a procedure for programming a PRAM cell to a set state, in accordance with a first embodiment of the invention. The flowchart illustrates the process of automatic control of the set pulse width in accordance with this embodiment of the invention. In this procedure, the state of the PRAM cell being programmed is monitored during programming by detecting the voltage $V_{BL}$ on the cell bit line and comparing the bit line voltage to the reference voltage $V_{REF}$. According to the procedure 600, a first pulse, e.g., the set pulse, is applied to the bit line of the cell being programmed in step 610. The voltage on the bit line $V_{BL}$ is monitored and compared to the reference voltage $V_{REF}$, and, in step 620, while the set pulse is applied, the procedure waits for the bit line voltage $V_{BL}$ to be below the reference voltage $V_{REF}$. When that occurs, the pulse is disconnected from the bit line in step 630.

Figure 14:
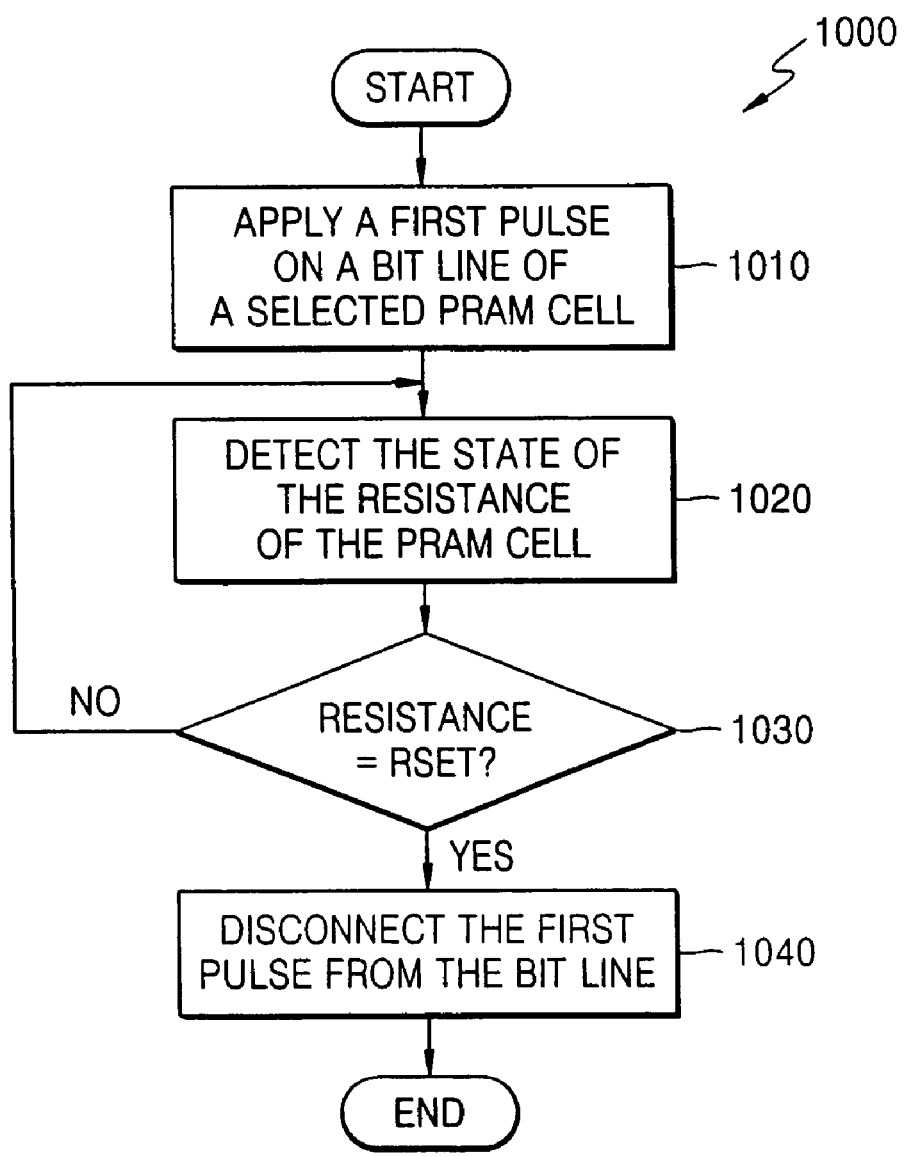
FIG. 14 is a flowchart illustrating the logical flow of a procedure for programming a PRAM cell to a set state, in accordance with a second embodiment of the invention.

FIG. 14 is a flowchart illustrating the logical flow of a procedure for programming a PRAM cell to a set state, in accordance with a second embodiment of the invention. The flowchart illustrates the process of automatic control of the set pulse width in accordance with this embodiment of the invention. In this procedure, the state of the PRAM cell being programmed is monitored during programming by detecting the voltage $V_{BL}$ on the cell bit line and comparing the bit line voltage to the reference voltage $V_{REF}$. According to the procedure 1000, a first pulse, e.g., the set pulse, is applied to the bit line of the cell being programmed in step 1010. The resistance of the cell is monitored in step 1020, and, in step 1030, is compared to a set resistance $R_{SET}$. While the set pulse is applied, the procedure waits for the resistance of the cell to be at the set resistance $R_{SET}$ in step 1030. When that occurs, the pulse is disconnected from the bit line in step 1040.

Figure 15:
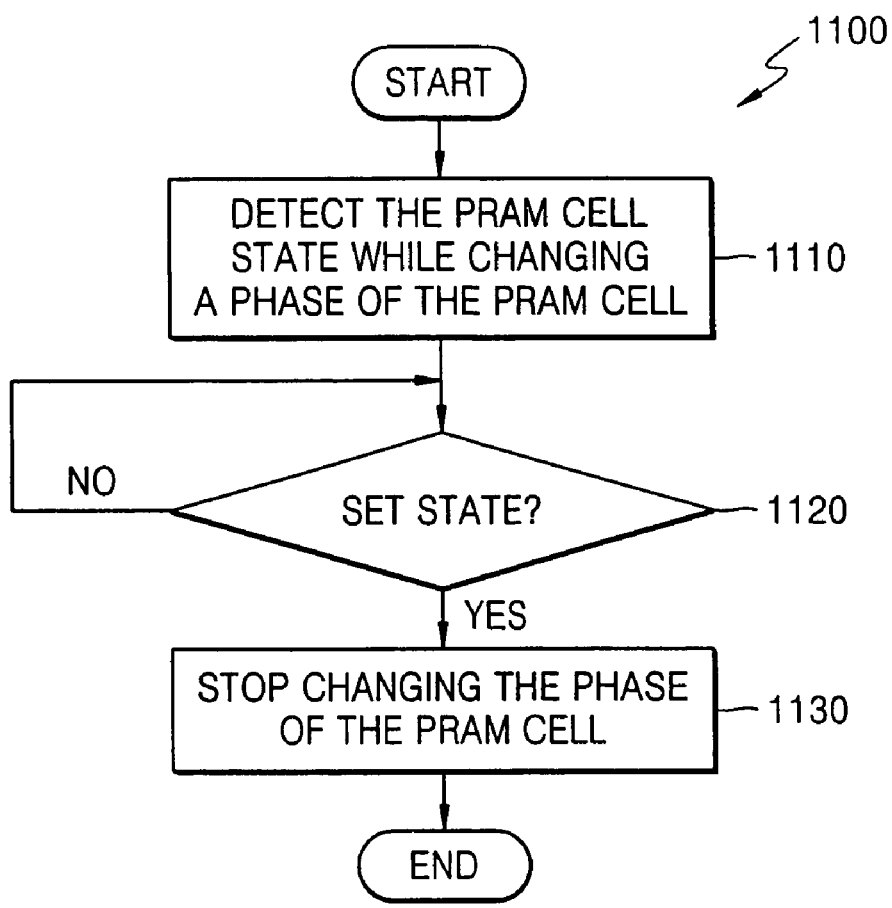
FIG. 15 is a flowchart illustrating the logical flow of the general procedure for programming a PRAM cell to the set state, in accordance with the invention.

FIG. 15 is a flowchart illustrating the logical flow of the general procedure for programming a PRAM cell to the set state, in accordance with the invention. The flowchart illustrates the process of automatic control of the set pulse width in accordance with the invention. In this procedure, the state of the PRAM cell being programmed is monitored during programming by detecting the phase of the programmable chalcogenide material in the cell. According to the procedure 1100, the procedure begins by initiating a change in phase of the PRAM cell in step 1110. The state of the cell is monitored during the phase change to determine if the cell is in the set state. In step 1120, the procedure waits for the cell to be in the set state. When that occurs, phase change in the PRAM cell is stopped in step 1130.

While this invention has been particularly shown and described with reference to preferred embodiments thereof, it will be understood by those skilled in the art that various changes in form and details may be made therein without departing from the spirit and scope of the invention as defined by the appended claims.

The invention claimed is:

1. A method of programming a semiconductor memory device, comprising:
    applying a set pulse continuously to the memory device, applying the set pulse to the memory device comprises applying a current to a bit line of the memory device;
    while the set pulse is applied, detecting a state of the memory device; and
    when the memory device is determined to be in a desired set state, removing the set pulse by removing the current applied to the bit line of the memory device, such that duration of the set pulse is controlled based on the state of the memory device.

2. The method of claim 1, wherein, when the memory device is in a reset state, a programmable material of the memory device is in an amorphous state.

3. The method of claim 1, wherein, when the memory device is in the set state, a programmable material of the memory device is in a crystalline state.

4. The method of claim 3, wherein, when the memory device is in a reset state, a programmable material of the memory device is in an amorphous state.

5. The method of claim 1, wherein detecting a state of the memory device comprises detecting a resistance in the device.

6. The method of claim 5, wherein the detected resistance comprises resistance in a programmable material of the memory device.

7. The method of claim 6, wherein resistance of the programmable material in an amorphous state of the programmable material is higher than resistance of the programmable material in a crystalline state of the programmable material.

8. The method of claim 1, wherein detecting a state of the memory device comprises detecting a voltage of the bit line of the memory device.

9. The method of claim 8, wherein applying a set pulse to the memory device comprises generating a control signal which controls application of the set pulse to the memory device.

10. The method of claim 9, wherein the control signal is generated to cause the set pulse to be activated in response to a write enable signal.

11. The method of claim 9, wherein the control signal is generated to cause the set pulse to be activated.

12. The method of claim 9, wherein the control signal is generated to cause the set pulse to be removed when the detected bit line voltage is below a reference voltage.

13. The method of claim 12, wherein the reference voltage is a set programming voltage of a programmable material in the memory device.

14. The method of claim 9, wherein the control signal is generated to cause the set pulse to be removed when the detected bit line voltage is equal to a reference voltage.

15. The method of claim 9, wherein, when the memory device is being programmed to a set state from a reset state, the control signal is generated to cause the set pulse to be applied while the memory device transitions from the reset state to the set state and removed after the transition.

16. The method of claim 9, wherein, when the memory device is being programmed to a set state from a reset state, the control signal is generated to cause the set pulse to be applied while the detected bit line voltage is above a reference voltage and removed after the detected bit line voltage drops below the reference voltage.

17. The method of claim 9, wherein, when the memory device is being programmed to a set state from the set state, the control signal is generated to be applied in response to a write enable signal and removed when it is determined that the detected bit line voltage is below a reference voltage.

18. The method of claim 9, wherein, when the memory device is being programmed to a set state from the set state, the control signal is generated to be applied in response to a write enable signal and removed when it is determined that the detected bit line voltage is equal to a reference voltage.

19. The method of claim 1, wherein detecting a state of the memory device comprises detecting a voltage of the bit line while the current is applied to the bit line.

20. The method of claim 1, wherein applying a set pulse to the memory device comprises generating a control signal which controls application of the set pulse to the memory device.

21. The method of claim 1, wherein the memory device comprises a phase change material.

22. The method of claim 21, wherein the phase change material comprises germanium, antimony and tellurium.

23. The method of claim 1, wherein the memory device comprises at least one chalcogenide element.

24. The method of claim 1, wherein a reset current in the memory device is greater than a set current in the memory device.

25. The method of claim 1, wherein a reset pulse width is narrower than a set pulse width.

26. A semiconductor memory device, comprising:
 a detecting circuit for detecting a state of the memory device; and
 a controller for continuously applying a set pulse to the memory device by continuously applying a current to a bit line of the memory device, the controller removing the set pulse when the memory device is detected to be in a desired set state, such that duration of the set pulse is controlled based on the state of the memory device.

27. The semiconductor memory device of claim 26, further comprising a programmable material, wherein, in a first state, the programmable material is in an amorphous state.

28. The semiconductor memory device of claim 26, further comprising a programmable material, wherein, in a first state, the programmable material is in a crystalline state.

29. The semiconductor memory device of claim 28, wherein, in a second state, the programmable material is in an amorphous state.

30. The semiconductor memory device of claim 26, wherein the detecting circuit detects a resistance in the device.

31. The semiconductor memory device of claim 30, wherein the detected resistance comprises resistance in a programmable material of the memory device.

32. The semiconductor memory device of claim 26, wherein the detecting circuit detects a voltage of the bit line of the memory device.

33. The semiconductor memory device of claim 32, wherein the detecting circuit comprises a sense amplifier.

34. The semiconductor memory device of claim 33, wherein the sense amplifier compares the voltage of the bit line to a reference voltage.

35. The semiconductor memory device of claim 34, wherein the reference voltage is a set programming voltage of a programmable material in the memory device.

36. The semiconductor memory device of claim 32, wherein the controller further comprises a control signal generator for generating a control signal which controls application of the set pulse to the memory device.

37. The semiconductor memory device of claim 36, wherein the control signal is generated to cause the set pulse to be activated in response to a write enable signal.

38. The semiconductor memory device of claim 36, wherein the control signal is generated to cause the set pulse to be activated.

39. The semiconductor memory device of claim 36, wherein the control signal is generated to cause the set pulse to be removed when the detected bit line voltage is below a reference voltage.

40. The semiconductor memory device of claim 36, wherein the control signal is generated to cause the set pulse to be removed when the detected bit line voltage is equal to a reference voltage.

41. The semiconductor memory device of claim 36, wherein, when the memory device is being programmed to a set state from a reset state, the control signal is generated to cause the set pulse to be applied while the memory device transitions from the reset state to the set state and removed after the transition.

42. The semiconductor memory device of claim 36, wherein, when the memory device is being programmed to a set state from a reset state, the control signal is generated to cause the set pulse to be applied while the detected bit line voltage is above a reference voltage and removed after the detected bit line voltage drops below the reference voltage.

43. The semiconductor memory device of claim 36, wherein, when the memory device is being programmed to a set state from the set state, the control signal is generated to be applied in response to a write enable signal and removed when it is determined that the detected bit line voltage is below a reference voltage.

44. The semiconductor memory device of claim 36, wherein, when the memory device is being programmed to a set state from the set state, the control signal is generated to be applied in response to a write enable signal and removed when it is determined that the detected bit line voltage is equal to a reference voltage.

45. The semiconductor memory device of claim 26, further comprising a driver for applying the current to the bit line of the memory device.

46. The semiconductor memory device of claim 1, wherein the driver applies a set current to the bit line in response to a set enable signal.

47. The semiconductor memory device of claim 45, wherein the driver applies a reset current to the bit line in response to a reset enable signal.

48. The semiconductor memory device of claim 26, wherein the detecting circuit detects a voltage of the bit line while the current is applied to the bit line.

49. The semiconductor memory device of claim 26, wherein the controller further comprises a control signal generator which generates a control signal which controls application of the set pulse to the memory device.

50. The semiconductor memory device of claim 26, wherein the memory device comprises a phase change material.

51. The semiconductor memory device of claim 50, wherein the phase change material comprises germanium, antimony and tellurium.

52. The semiconductor memory device of claim 26, wherein the memory device comprises at least one chalcogenide element.

53. The semiconductor memory device of claim 26, wherein a reset current in the memory device is greater than a set current in the memory device.

54. The semiconductor memory device of claim 26, wherein a reset pulse width is narrower than a set pulse width.

* * * * *

UNITED STATES PATENT AND TRADEMARK OFFICE
CERTIFICATE OF CORRECTION

| | | |
|---|---|---|
| PATENT NO. | : 7,085,154 B2 | Page 1 of 1 |
| APPLICATION NO. | : 10/773901 | |
| DATED | : August 1, 2006 | |
| INVENTOR(S) | : Woo-yeong Cho et al. | |

It is certified that error appears in the above-identified patent and that said Letters Patent is hereby corrected as shown below:

In Claim 46, Column 12, Line 55 delete "1" and insert --45--.

Signed and Sealed this

Nineteenth Day of December, 2006

JON W. DUDAS
*Director of the United States Patent and Trademark Office*